(12) United States Patent
Kim et al.

(10) Patent No.: US 7,888,599 B2
(45) Date of Patent: Feb. 15, 2011

(54) PRINTED CIRCUIT BOARD INCLUDING EMBEDDED CAPACITOR AND METHOD OF FABRICATING SAME

(75) Inventors: Young Woo Kim, Chungcheongnam-do (KR); Byoung Youl Min, Kyunggi-do (KR); Chang Myung Ryu, Gyeonggi-do (KR); Woo Lim Chae, Chungcheongnam-do (KR); Han Kim, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 402 days.

(21) Appl. No.: 12/203,081

(22) Filed: Sep. 2, 2008

(65) Prior Publication Data

US 2008/0314863 A1    Dec. 25, 2008

Related U.S. Application Data

(62) Division of application No. 11/096,411, filed on Mar. 31, 2005, now Pat. No. 7,435,911.

(30) Foreign Application Priority Data

Dec. 30, 2004    (KR) .............................. 2004-116807

(51) Int. Cl.
*H05K 1/00*    (2006.01)

(52) U.S. Cl. ................. 174/250; 174/257; 174/259; 174/260

(58) Field of Classification Search ...................... None
See application file for complete search history.

(56) References Cited

U.S. PATENT DOCUMENTS

| | | | |
|---|---|---|---|
| 5,079,069 A | | 1/1992 | Howard et al. |
| 5,536,908 A | * | 7/1996 | Etchells et al. .............. 174/257 |
| 6,349,456 B1 | | 2/2002 | Dunn et al. |
| 6,606,793 B1 | | 8/2003 | Dunn |
| 2003/0151032 A1 | * | 8/2003 | Ito et al. ..................... 252/570 |
| 2004/0003494 A1 | * | 1/2004 | Asami et al. .................. 29/830 |
| 2004/0118600 A1 | | 6/2004 | Lee et al. |

FOREIGN PATENT DOCUMENTS

| | | |
|---|---|---|
| JP | 11-204727 | 7/1999 |
| JP | 2004-087524 A | 3/2004 |
| JP | 2004-311720 A | 11/2004 |

* cited by examiner

*Primary Examiner*—Duy-Vu N Deo
(74) *Attorney, Agent, or Firm*—Fish & Richardson P.C.

(57) ABSTRACT

Disclosed is a PCB including an embedded capacitor and a method of fabricating the same. The long embedded capacitor is formed through an insulating layer, making a high capacitance and various capacitance designs possible.

3 Claims, 12 Drawing Sheets

PRINTED CIRCUIT BOARD INCLUDING EMBEDDED CAPACITOR AND METHOD OF FABRICATING SAME

INCORPORATION BY REFERENCE

This application is a divisional of U.S. patent application Ser. No. 11/096,411, filed Mar. 31, 2005, which claims priority under 35 U.S.C. §119 to Korean Patent Application No. 2004-116807 filed on Dec. 30, 2004. The contents of these applications are incorporated herein by reference in their entirety.

BACKGROUND OF THE INVENTION

1. Field of the Invention

The present invention relates, in general, to a printed circuit board (PCB) including an embedded capacitor and a method of fabricating the same and, more particularly, to a PCB including an embedded capacitor, in which the long embedded capacitor is formed through an insulating layer, having a high capacitance and various capacitance designs possible, and a method of fabricating the same.

2. Description of the Prior Art

Recently, high integration and high speed of a semiconductor system has been realized, and thus, the operational speed and performance of a system that includes a semiconductor chip depends on components outside the semiconductor chip as well as those inside the semiconductor chip. Therefore, it is important to assure signal integrity inside and outside the semiconductor chip during the design process.

Furthermore, high speed switching of the semiconductor chip and high frequency signal transmission in electronic systems causes noise due to electromagnetic interference. Particularly, cross talk noise and simultaneous switching noise between adjacent wires and input and output pins serve to reduce signal integrity in the course of designing a high density circuit.

Accordingly, there remains a need to overcome problems with respect to power use, ground bouncing, and power bouncing when many semiconductor chips are mounted on highly dense circuits on PCBs. Hence, the roles of decoupling capacitors and bypass capacitors are very important.

However, in a conventional passive component, resonance occurs within a range of undesired frequency band because of inductance due to a lead line. Hence, embedding the passive component into the PCB is suggested in order to avoid the above problems in a high density mounting technology regarding the PCB.

Generally, discrete chip resistors or discrete chip capacitors have frequently been mounted on most PCBs, but recently, PCBs, in which resistors or capacitors are embedded, are developing.

An embedded PCB has a structure in which the capacitor is mounted on the surface of PCBs or embedded inside PCBs, and if the capacitor is integrated with the PCB to act as one part of the PCB regardless of the size of the PCB, the capacitor is called an "embedded (buried) capacitor" and the resulting PCB is called "printed circuit board including embedded capacitor".

Typically, the technology of fabricating a PCB including a capacitor embedded therein may be classified into four methods.

Firstly, there is a method of fabricating a polymer thick film type of capacitor, in which the application of a polymer capacitor paste and thermal hardening, that is, drying, are conducted to fabricate a capacitor. In the above method, after the polymer capacitor paste is applied on an internal layer of a PCB and dried, a copper paste is printed on the resulting PCB and dried so that electrodes are formed, thereby making an embedded capacitor.

A second method is to apply a ceramic filled photosensitive resin on a PCB to fabricate a discrete type of embedded capacitor. Motorola Inc. in USA holds a patent for related technologies. In detail, the photosensitive resin containing ceramic powder is applied on the PCB, a copper foil is laminated on the resulting PCB to form upper and lower electrodes, a circuit pattern is formed, and the photosensitive resin is etched to fabricate the discrete type of capacitor.

A third method is to insert an additional dielectric layer having a capacitive characteristic in an internal layer of a PCB so as to substitute for a decoupling capacitor conventionally mounted on a surface of a PCB, thereby fabricating a capacitor. Sanmina Corp. in USA holds a patent for related technologies. According to the third method, the dielectric layer including a power supply electrode and a grounded electrode is inserted into the internal layer of the PCB to fabricate a power distribution type of decoupling capacitor.

A fourth method relates to a PCB including an embedded capacitor, in which a high dielectric polymer capacitor paste that is made of a compound of $BaTiO_3$ and an epoxy resin is packed in an internal layer via hole through the PCB, and a method of fabricating the same. Samsung Electro-Mechanics Corp. in Korea holds a patent for this method. In the fourth method, the via hole is formed through the PCB, and the method comprises 8 steps, which range from a step of forming a plurality of internal layer via holes through a predetermined portion of a copper clad laminate to a step of plating an external layer via hole and a wall of a through hole.

Figure 1A:
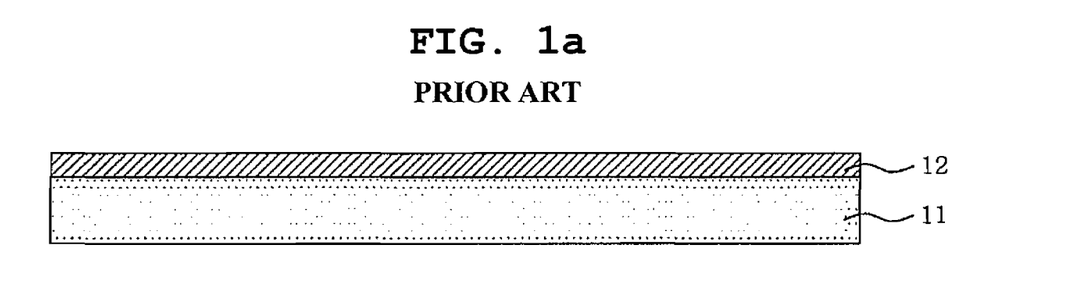
FIGS. 1a to 1n are sectional views illustrating a conventional procedure of fabricating a PCB including an embedded capacitor.
Figure 1B:
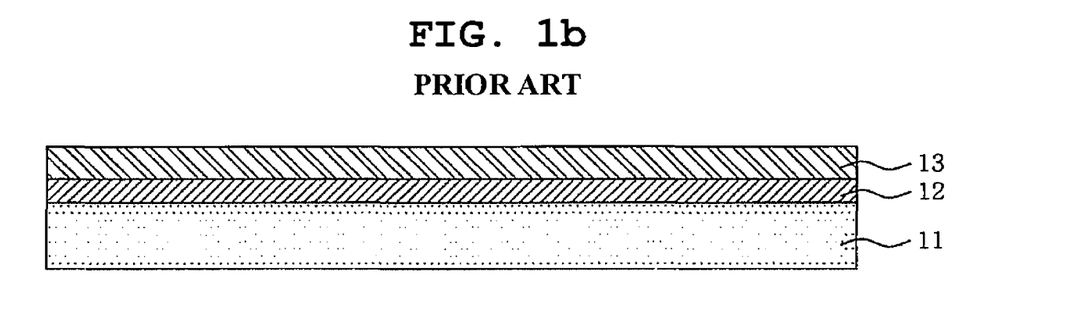
Figure 1C:
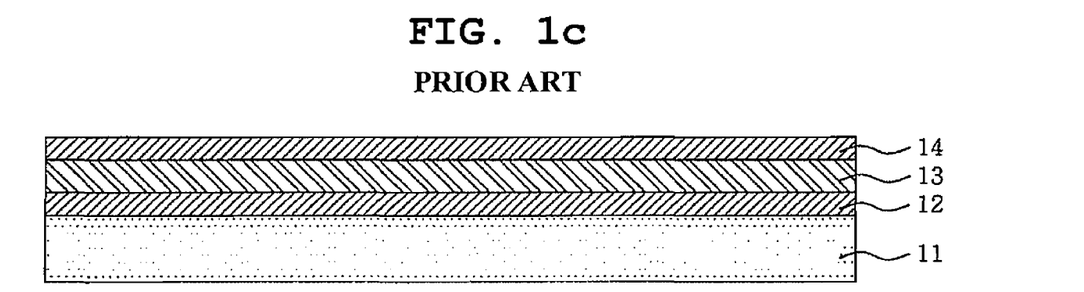
Figure 1D:
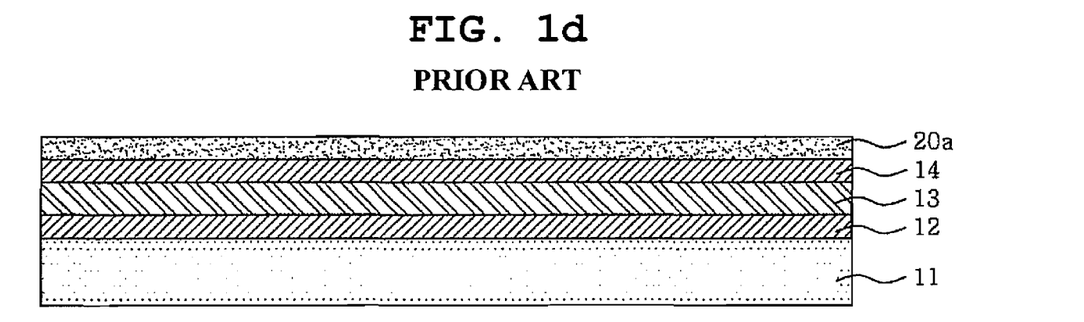
Figure 1E:
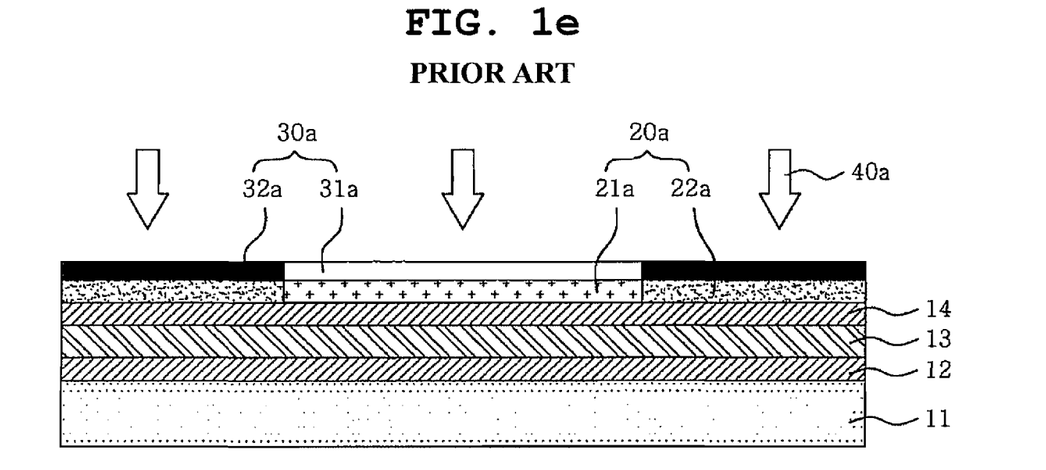
Figure 1F:
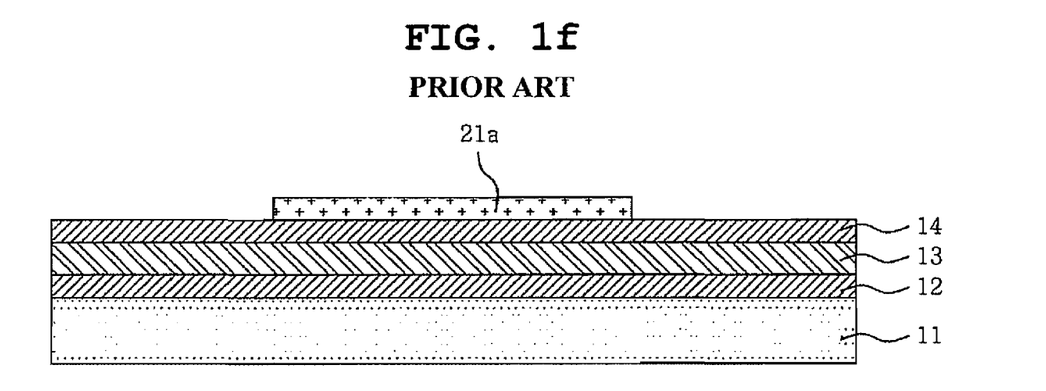
Figure 1G:
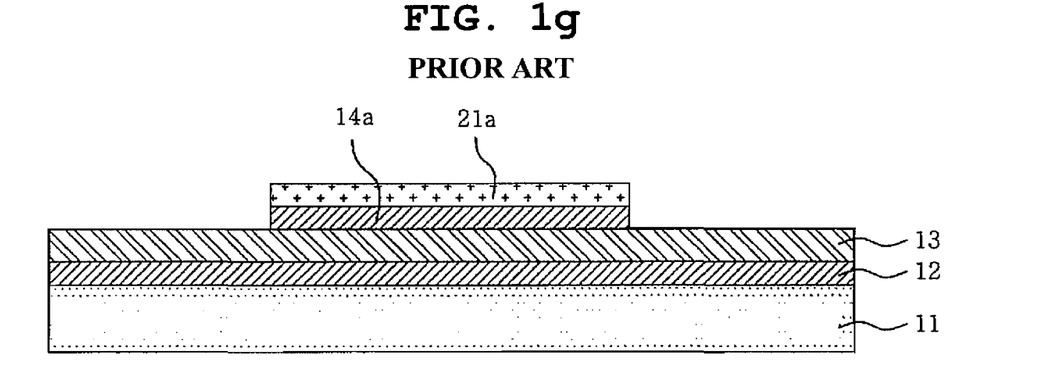
Figure 1H:
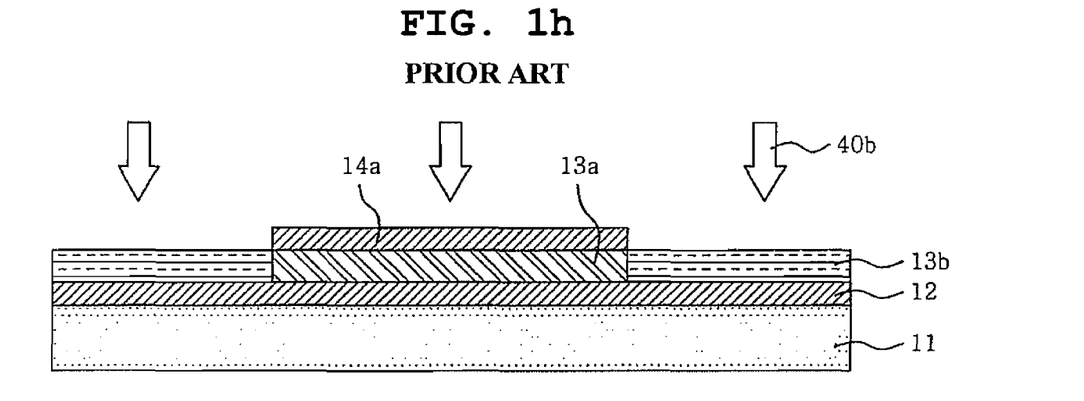
Figure 1I:
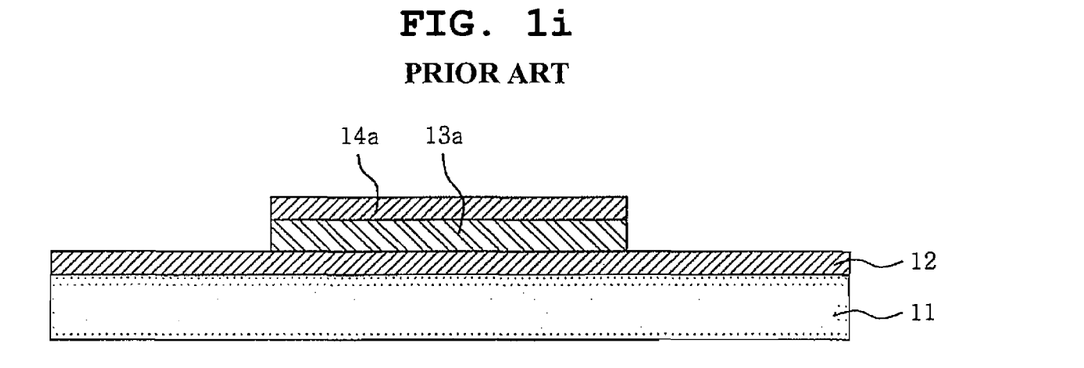
Figure 1J:
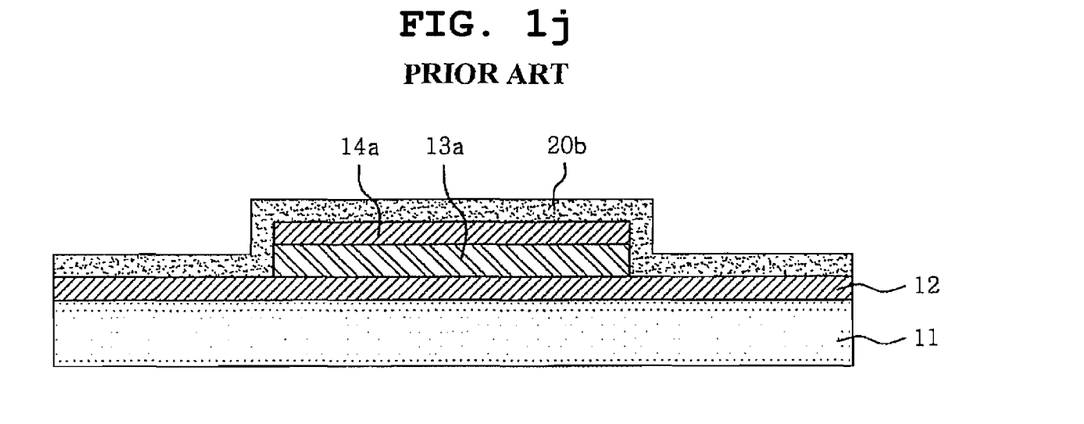
Figure 1K:
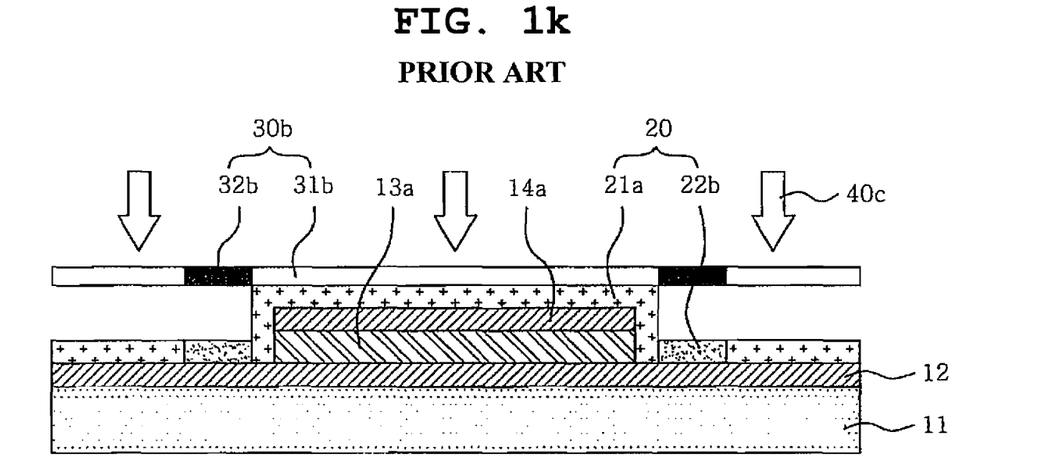
Figure 1L:
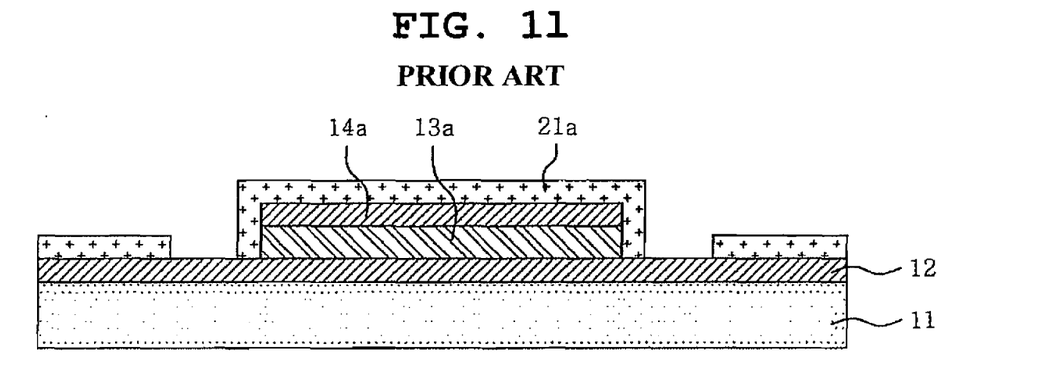
Figure 1M:
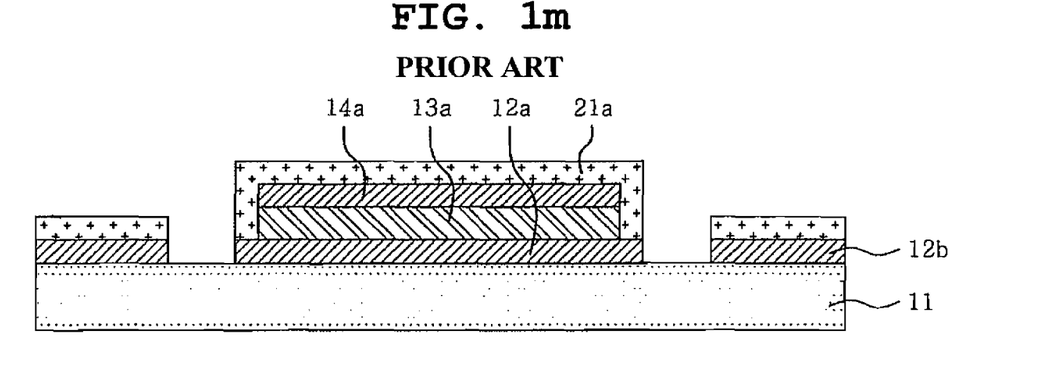
Figure 1N:
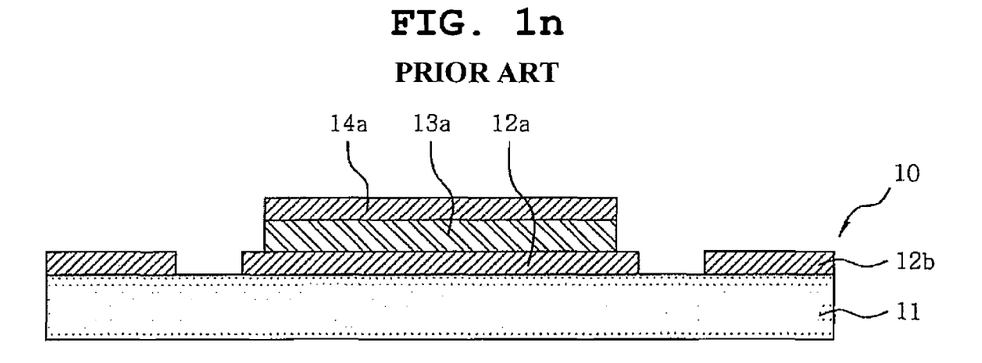

FIGS. 1a to 1n are sectional views illustrating a conventional procedure of fabricating a PCB including an embedded capacitor.

As shown in FIG. 1a, a copper clad laminate, in which a first copper foil layer 12 is formed on an insulating layer 11, is prepared.

As shown in FIG. 1b, a photosensitive dielectric material 13 is layered on the first copper foil layer 12.

As shown in FIG. 1c, a second copper foil layer 14 is laminated on the photosensitive dielectric material 13.

As shown in FIG. 1d, a photosensitive film 20a is laminated on the second copper foil layer 14.

As shown in FIG. 1e, a photo-mask 30a, on which a predetermined capacitor pattern is formed, is closely adhered to the photosensitive film 20a, and subsequently irradiated with ultraviolet rays 40a. At this stage, ultraviolet rays 40a penetrate an unprinted portion 31a of the photo-mask 30a to form a hardened portion 21a of the photosensitive film 20a under the photo-mask 30a. Ultraviolet rays 40a do not penetrate a black printed portion 32a of the photo-mask 30a, thus an unhardened portion 22a of the photosensitive film 20a remains under the photo-mask 30a.

As shown in FIG. 1f, after the photo-mask 30a is removed, a development process is conducted to remove the unhardened portion 22a of the photosensitive film 20a while only the hardened portion 21a of the photosensitive film 20a remains.

As shown in FIG. 1g, the second copper foil layer 14 is etched using the hardened portion 21a of the photosensitive film 20a as an etching resist, thereby forming an upper electrode layer 14a of an embedded capacitor thereon.

As shown in FIG. 1h, after the hardened portion 21a of the photosensitive film 20a is removed, ultraviolet rays 40b are radiated onto the photosensitive dielectric material 13 using the upper electrode layer 14a as a mask. At this stage, a portion of the photosensitive dielectric material 13, on which the upper electrode layer 14a is not formed, absorbs ultraviolet rays 40b to form a reacted portion 13b, which is capable of being decomposed during a development process using a special solvent (for example, GBL (gamma-butyrolactone)). The other portion of the photosensitive dielectric material 13, on which the upper electrode layer 14a is formed, does not absorb ultraviolet rays 40b, resulting in the persistence of an unreacted portion 13a.

As shown in FIG. 1i, the development process is conducted to remove the portion 13b of the photosensitive dielectric material 13 that reacted due to the ultraviolet rays, thereby forming a dielectric layer 13a of the embedded capacitor on the photosensitive dielectric material 13.

As shown in FIG. 1j, a photosensitive resin 20b is layered on the first copper foil layer 12, the dielectric layer 13a, and the upper electrode layer 14a.

As shown in FIG. 1k, a photo-mask 30b, on which a predetermined circuit pattern is formed, is closely adhered to the photosensitive resin 20b, and then irradiated with ultraviolet rays 40c. At this stage, ultraviolet rays 40c penetrate an unprinted portion 31b of the photo-mask 30b to form a hardened portion 21b of the photosensitive resin 20b under the photo-mask 30b. Ultraviolet rays 40c do not penetrate a black printed portion 32b of the photo-mask 30b, thus an unhardened portion 22b of the photosensitive resin 20b remains under the photo-mask 30b.

As shown in FIG. 1l, after the photo-mask 30b is removed, a development process is conducted to remove the unhardened portion 22b of the photosensitive resin 20b while only the hardened portion 21b of the photosensitive resin 20b remains.

As shown in FIG. 1m, the first copper foil layer 12 is etched using the hardened portion 21b of the photosensitive resin 20b as an etching resist, thereby forming a lower electrode layer 12a and the circuit pattern 12b of the embedded capacitor thereon.

As shown in FIG. 1n, the hardened portion 21b of the photosensitive resin 20b is removed. After an insulating layer is laminated, circuit pattern formation, solder resist formation, nickel/gold plating, and external structure formation processes are implemented, thereby creating the PCB 10 including the embedded capacitor.

The conventional procedure of fabricating the PCB 10 including the embedded capacitor is schematically disclosed in U.S. Pat. No. 6,349,456 assigned to Motorola Inc. in USA.

Meanwhile, recently, an increase in a self resonance frequency (SRF) of a passive component, such as a capacitor, which is mounted on a PCB, is required according to a frequency increase needed in a high-frequency system. Furthermore, in a decoupling capacitor used to stabilize a power source, it is necessary to reduce impedance at a high frequency.

To improve the SRF of the capacitor and reduce impedance at the high frequency, demand for an embedded capacitor, which is capable of reducing parasitic inductance in a capacitor, is growing. In PCB design, since the integration of circuit patterns continuously increases, circuit patterns must be made fine.

However, in the conventional PCB 10 including the embedded capacitor, as shown in FIG. 1k, surface level variation occurs between the photo-mask 30b and the photosensitive resin 20b during an exposure process, causing diffraction of ultraviolet rays 40c at a corner of the black printed portion 32b of the photo-mask 30b. Thus, as shown in FIG. 1l, the conventional PCB has an undesirable lower limit to the width of a pattern of the photosensitive resin 20b.

Additionally, as shown in FIG. 1j, in the conventional PCB 10 including the embedded capacitor, the photosensitive resin 20b must be applied on a wall of the dielectric layer 13a so as to protect the dielectric layer 13a during a process of etching the first copper foil layer to form the lower electrode layer 12a and the circuit pattern 12b. Accordingly, as shown in FIG. 1n, a portion of the lower electrode layer 12a unnecessarily protrudes from the upper electrode layer 14a and the dielectric layer 13a.

The protrusion of the lower electrode layer 12a acts as a conductor in a high frequency environment, causing parasitic inductance, resulting in poor electric performance of electronic goods.

As well, the conventional PCB 10 including the embedded capacitor is problematic in that since the electrode layers 12a, 14a are formed on the upper and lower sides of the PCB, integration of the embedded capacitor is poor, thus limiting an increase of capacitance.

SUMMARY OF THE INVENTION

Therefore, the present invention has been made keeping in mind the above disadvantages occurring in the prior arts, and an object of the present invention is to provide a PCB including an embedded capacitor, in which it is possible to realize a high capacitance and various capacitance designs, and a method of fabricating the same.

The above object can be accomplished by providing a PCB including an embedded capacitor. The embedded capacitor comprises a dielectric, which is formed through an insulating layer so as to have a predetermined length and which is longer than a width thereof; and first and second electrodes which extend along both longitudinal walls of the dielectric to be in contact with the dielectric.

Furthermore, the present invention provides a method of fabricating a PCB including an embedded capacitor. The method includes the steps of (A) forming an opening through a copper clad laminate so that the opening is formed through upper and lower copper foil layers of the copper clad laminate and has a predetermined length; (B) forming first copper plating layers on the upper and lower copper foil layers of the copper clad laminate and on walls of the opening; (C) packing a high dielectric material in the opening, on the walls of which the first copper plating layers have already been formed; (D) forming second copper plating layers on the first copper plating layers and on the high dielectric material; and (E) partially etching the upper and lower copper foil layers, and the first and second copper plating layers in such a way that first and second electrodes are formed so as to extend along both longitudinal walls of a structure, which consists of the high dielectric material, to be in contact with the structure.

BRIEF DESCRIPTION OF THE DRAWINGS

The above and other objects, features and other advantages of the present invention will be more clearly understood from the following detailed description taken in conjunction with the accompanying drawings, in which:

FIGS. 3a to 3l are perspective views illustrating the fabrication of the PCB including the embedded capacitor, according to an embodiment of the present invention;

DETAILED DESCRIPTION OF THE INVENTION

Hereinafter, a detailed description will be given of a PCB including an embedded capacitor and a method of fabricating the same according to the present invention, with reference to the drawings.

Figure 2:
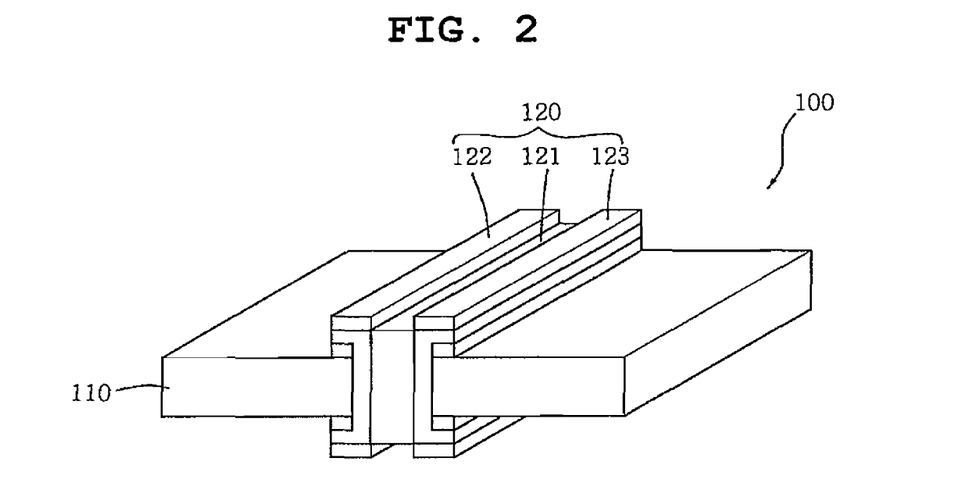
FIG. 2 is a perspective view of a PCB including an embedded capacitor, according to an embodiment of the present invention.

FIG. 2 is a perspective view of a PCB including an embedded capacitor, according to an embodiment of the present invention.

As shown in FIG. 2, the PCB 100 including the embedded capacitor according to an embodiment of the present invention is provided with an insulating layer 110 and the embedded capacitor 120.

The insulating layer 110 serves to preserve and maintain an electric insulation property, mechanical strength, and dimensional stability of the PCB 100 including the embedded capacitor, and may be made of an epoxy resin, a polyimide resin, a BT resin (bismaleimide triazine resin), a phenol resin, or a thermoplastic liquid crystal polymer. Additionally, the insulating layer 110 may contain glass fiber, glass non-woven fabric, or paper which is used as a material for reinforcing mechanical strength and heat resistance.

The embedded capacitor 120 is formed through the insulating layer 110, and is provided with a dielectric 121, a first electrode 122, and a second electrode 123.

The dielectric 121 is formed through the insulating layer 110 so as to have a predetermined length longer than a width thereof. Consisting of a high dielectric material, the dielectric 121 has both longitudinal walls perpendicular to surfaces of the insulating layer 110.

The first electrode 122 and the second electrode 123 extend along the both longitudinal walls of the dielectric 121 to be in contact with the dielectric. In this regard, the first electrode 122 and the second electrode 123 are made of a conductive material, such as copper (Cu), gold (Au), nickel (Ni), or tin (Sn), and are preferably formed through a plating process.

As shown in FIG. 2, the embedded capacitor 120 according to the present invention is advantageous in that since it is formed through the insulating layer 110 so as to have a relatively long length, it is easy to control the capacitance thereof.

Furthermore, the embedded capacitor 120 according to the present invention is long and may assume various shapes, thereby making various designs and high capacitance possible.

FIGS. 3a to 3l are perspective views illustrating the fabrication of the PCB including the embedded capacitor, according to an embodiment of the present invention.

Figure 3A:
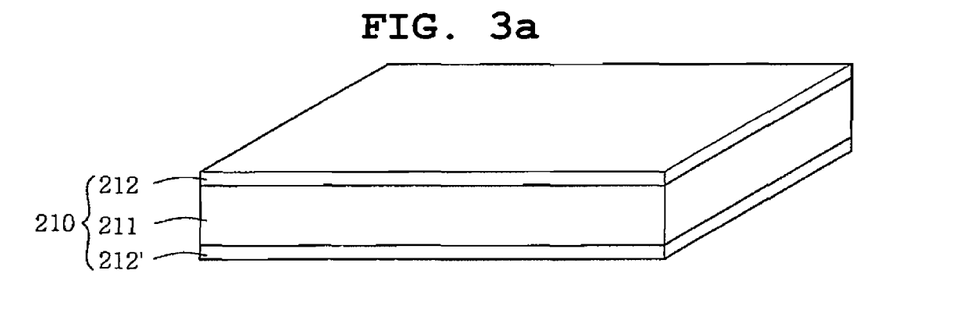

As shown in FIG. 3a, a copper clad laminate 210, in which copper foil layers 212, 212' are layered on both sides of an insulating resin layer 211, is prepared.

In this regard, the copper clad laminate 210 may be classified into a glass/epoxy copper clad laminate, a heat-resistant resin copper clad laminate, a paper/phenol copper clad laminate, a high-frequency copper clad laminate, a flexible copper clad laminate, or a composite copper clad laminate, depending on the application.

Figure 3B:
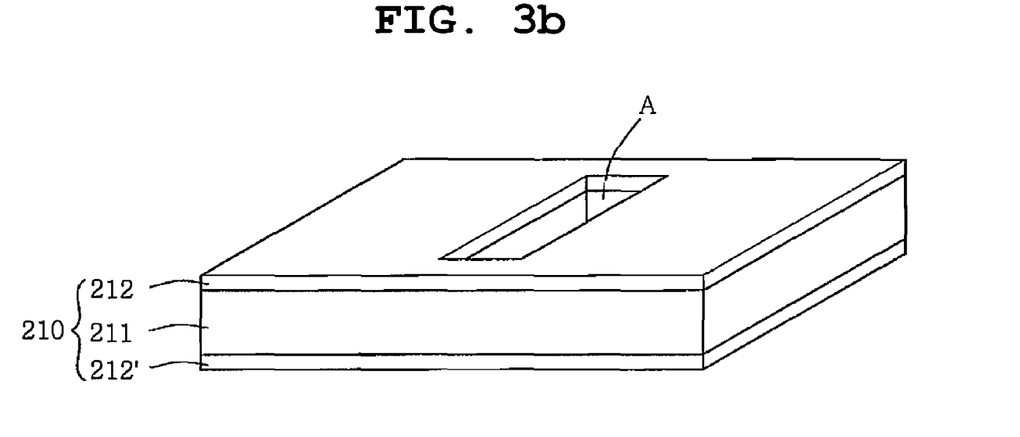

As shown in FIG. 3b, an opening (A) is formed through the upper and lower copper foil layers 212, 212' of the copper clad laminate 210 so as to have a predetermined length.

It is preferable that the opening (A) be formed using a router drill or a CNC drill (computer numerical control drill).

Preferably, after the opening (A) is formed using the router drill or CNC drill, a deburring process may be further conducted to remove burrs, generated during the drilling process, from the upper and lower copper foil layers 212, 212', and dust adhering to walls of the opening (A) and to surfaces of the copper foil layers 212, 212'. In this case, the surfaces of the copper foil layers 212, 212' become rough, thus improving the adhesion strength of copper to the copper foil layers in a subsequent copper plating process.

More preferably, after the formation of the opening (A) using the router drill or the CNC drill, a desmear process may be further implemented so as to remove a smear which is formed on the walls of the opening (A) by melting the insulating resin layer 211 due to heat generated during the drilling process.

Figure 3C:
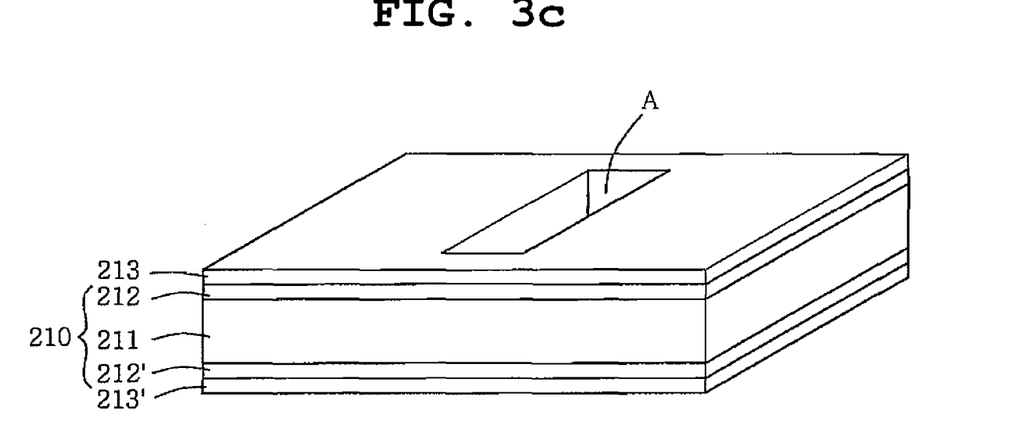

As shown in FIG. 3c, first copper plating layers 213, 213' are formed on the upper and lower copper foil layers 212, 212' and on the walls of the opening (A) of the copper clad laminate 210.

Since the walls of the opening (A) each include the insulating resin layer 211, it is impossible to conduct an electrolytic copper plating process immediately. Accordingly, an electroless copper plating process is conducted so that the opening (A) is desirably subjected to the electrolytic copper plating process.

For example, the electroless copper plating process may use a catalyst deposition method which includes a degreasing step, a soft etching step, a pre-catalyst treating step, a catalyst treating step, an acceleration step, an electroless copper plating step, and an anti-oxidizing step.

Alternatively, the electroless copper plating process may use a sputtering method, in which gas ion particles (for example, $Ar^+$), generated by a plasma or the like, collide with a copper target to form electroless copper plating layers on the upper and lower copper foil layers 212, 212' and on the walls of the opening (A).

After the completion of the electroless copper plating process, the copper clad laminate 210 is dipped into a copper plating tub, and the electrolytic copper plating process is then conducted using a D.C. rectifier. Preferably, the electrolytic copper plating process is conducted in such a way that after an area to be plated is calculated, a proper amount of electricity is applied to the D.C. rectifier to achieve the deposition of copper.

Figure 3D:
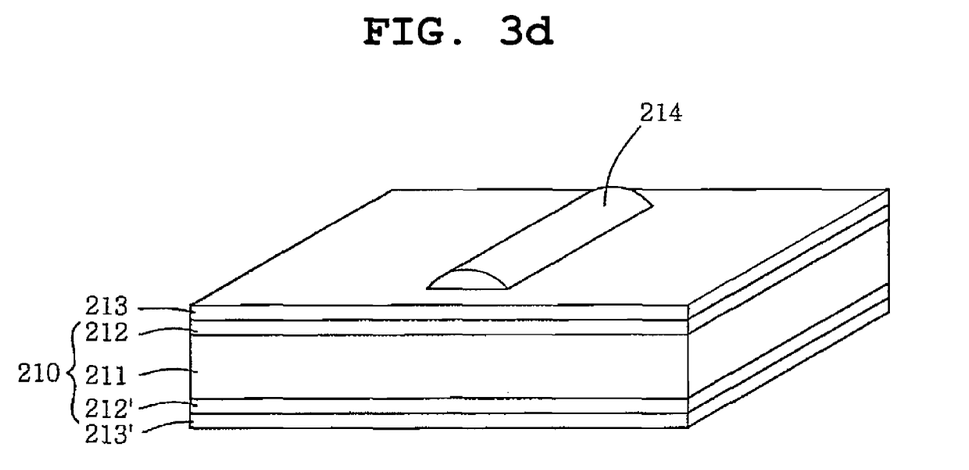

As shown in FIG. 3d, a high dielectric material 214 is packed in the opening (A) of the copper clad laminate 210 to form a dielectric of the embedded capacitor.

Figure 3E:
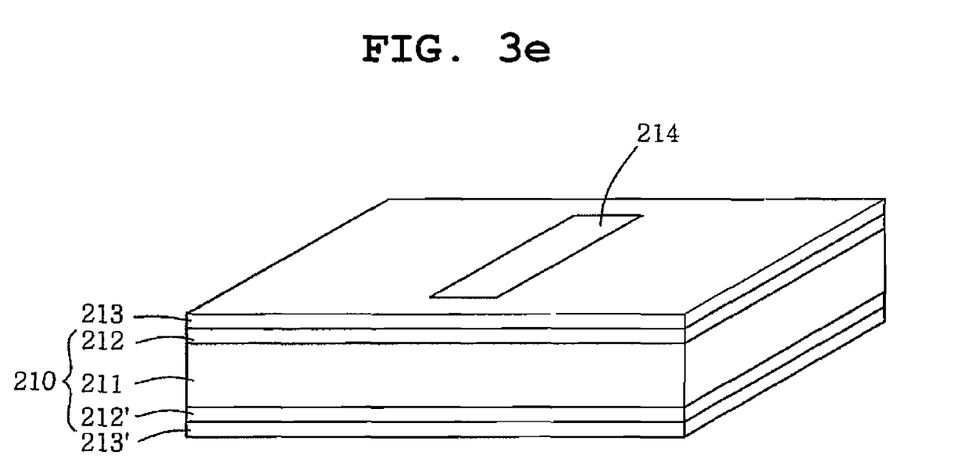

As shown in FIG. 3e, portions of the high dielectric material 214, which protrude from surfaces of the copper clad laminate 210 (in other words, the first copper plating layers 213, 213'), are removed using a buff or the like to make the resulting copper clad laminate flat.

Figure 3F:
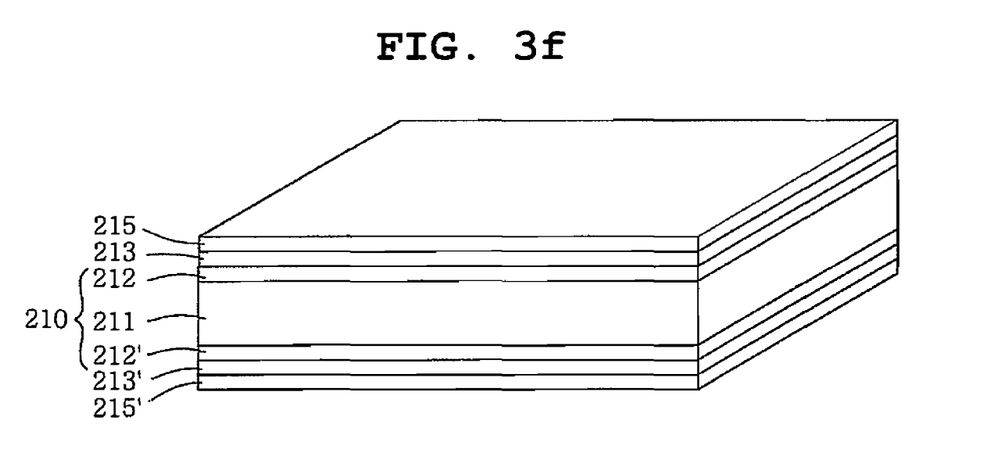

As shown in FIG. 3f, second copper plating layers 215, 215' are formed on the upper and lower first copper plating layers 213, 213' of the copper clad laminate 210 and on the high dielectric material 214.

With respect to this, since the high dielectric material 214 is exposed, it is preferable to conduct the electrolytic copper plating process after the electroless copper plating process is implemented using the catalyst deposition method or the sputtering method.

Figure 3G:
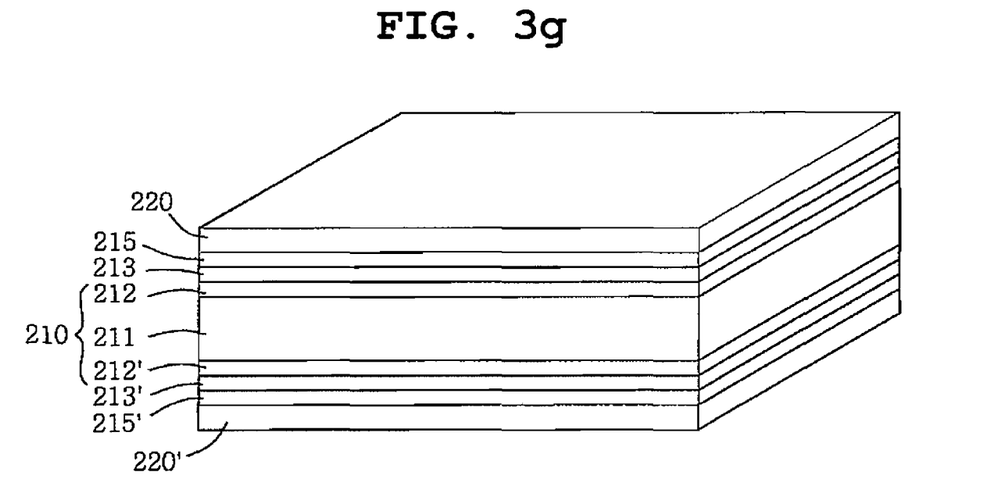

As shown in FIG. 3g, photosensitive films 220, 220' (for example, dry film) are applied on the upper and lower second copper plating layers 215, 215'.

Figure 3H:
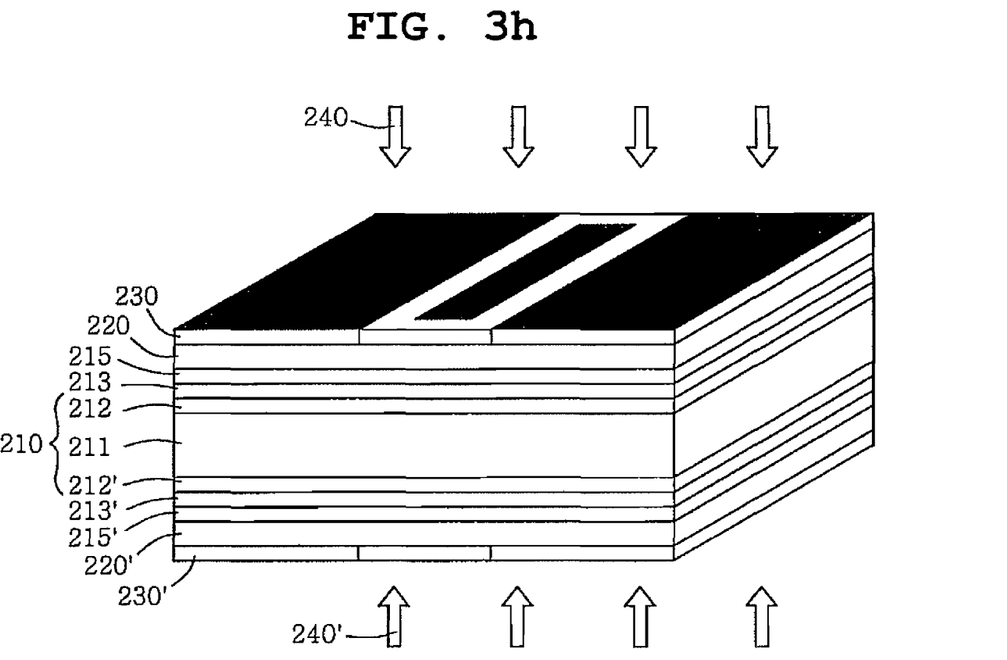

As shown in FIG. 3h, photo-masks 230, 230' having a predetermined circuit pattern formed thereon are mounted on the upper and lower photosensitive films 220, 220', and ultraviolet rays 240, 240' are then irradiated thereon.

At this stage, ultraviolet rays 240, 240' penetrate unprinted portions of the photo-masks 230, 230' to form cured portions of the photosensitive films 220, 220' under the photo-masks 230, 230', but do not penetrate black printed portions of the photo-masks 230, 230' to form uncured portions of the photosensitive films 220, 220' under the photo-masks 230, 230'.

Figure 3I:
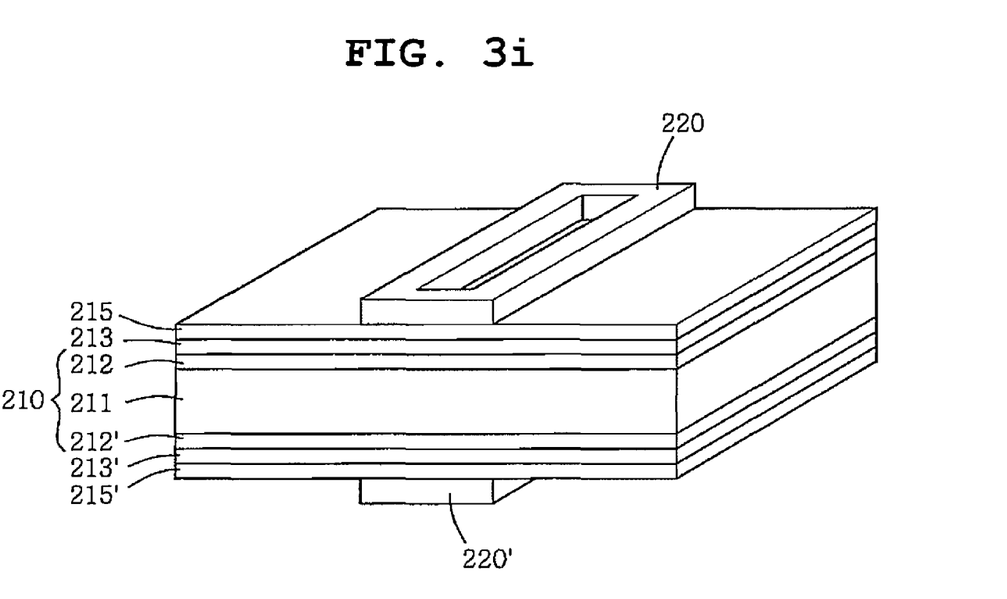

As shown in FIG. 3i, after the photo-masks 230, 230' are removed, a development process is conducted so that the cured portions of the photosensitive films 220, 220' remain, thereby removing the uncured portions of the photosensitive films 220, 220'.

Figure 3J:
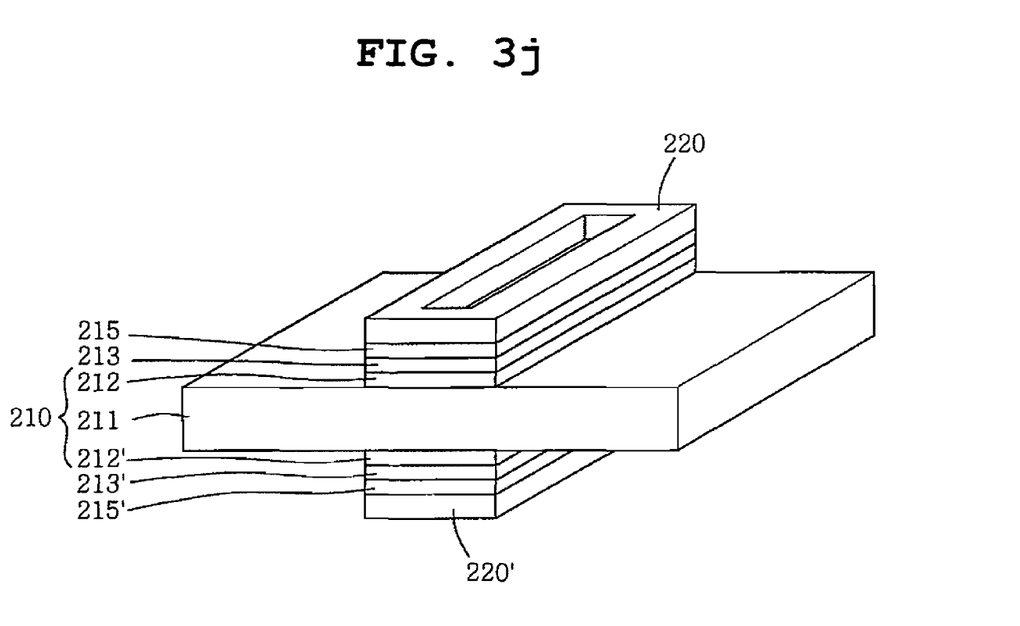

As shown in FIG. 3j, the cured portions of the photosensitive films 220, 220' are used as an etching resist to partially etch the upper and lower copper foil layers 212, 212', the first copper plating layers 213, 213', and the second copper plating layers 215, 215', thereby forming first and second electrodes of the embedded capacitor.

Figure 3K:
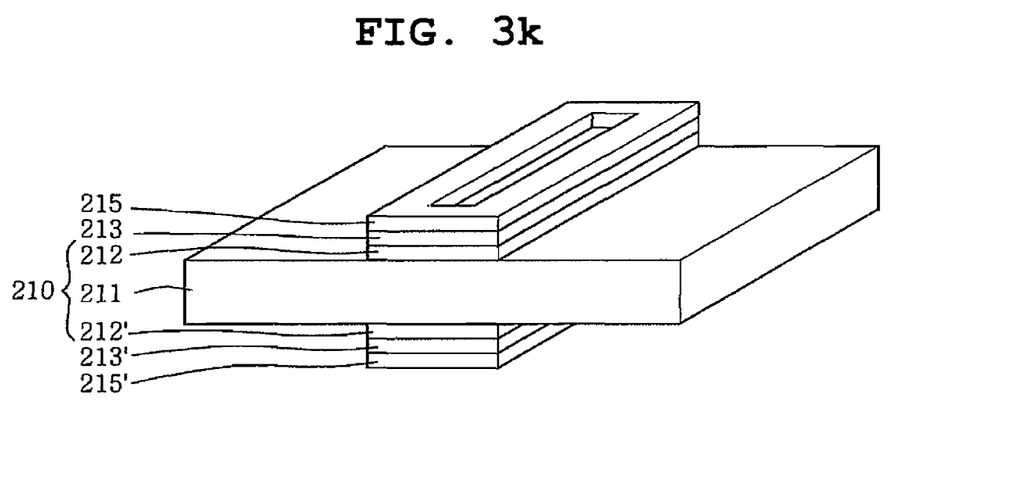

As shown in FIG. 3k, the cured portions of the photosensitive films 220, 220' are removed.

As shown in FIG. 3l, portions of the upper and lower copper foil layers 212, 212', the first copper plating layers 213, 213', and the second copper plating layers 215, 215', which correspond in position to transversal sides of the high dielectric material 214, are removed to separate the first and second electrodes from each other, thereby creating the PCB 200 including the embedded capacitor according to the present invention.

In this case, the CNC drill or a laser drill may be used to remove the portions of the upper and lower copper foil layers 212, 212', the first copper plating layers 213, 213', and the second copper plating layers 215, 215', which correspond in position to the transversal sides of the high dielectric material 214.

Figure 4:
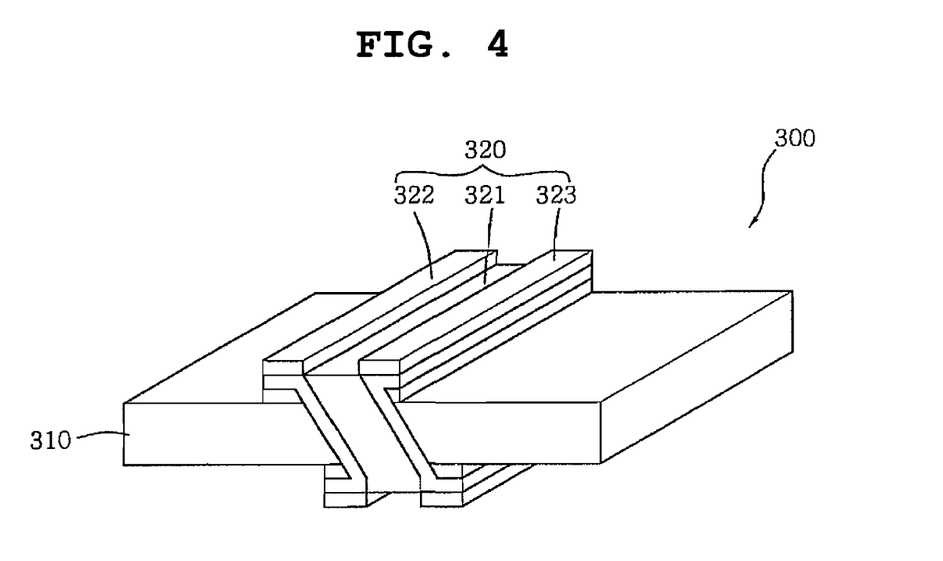
FIG. 4 is a perspective view of a PCB including an embedded capacitor, according to another embodiment of the present invention.

FIG. 4 is a perspective view of a PCB including an embedded capacitor, according to another embodiment of the present invention.

As shown in FIG. 4, the PCB 300 including the embedded capacitor according to the above embodiment of the present invention is provided with an insulating layer 310 and the embedded capacitor 320. The embedded capacitor 320 is provided with a dielectric 321, which is formed so as to have a predetermined length longer than a width thereof, and first and second electrodes 322, 323, which extend along longitudinal walls of the dielectric 321 while being in contact with the dielectric 321.

As shown in FIG. 4, since the embedded capacitor 320 according to the above embodiment of the present invention comprises the dielectric 321 having the both longitudinal walls that are inclined with respect to the surfaces of the insulating layer 310, when using an embedded capacitor having the same length and width, the capacitance of the embedded capacitor 320 according to the above embodiment is higher than that of the embedded capacitor 120 according to the previous embodiment as shown in FIG. 2.

Therefore, the PCB 300 including the embedded capacitor, according to the above embodiment of the present invention is advantageous in that the dielectric 321 is formed through the insulating layer 310 so that the both longitudinal walls of the dielectric 321 are inclined with respect to the surfaces of the insulating layer, thereby providing a high capacitance.

Figure 5:
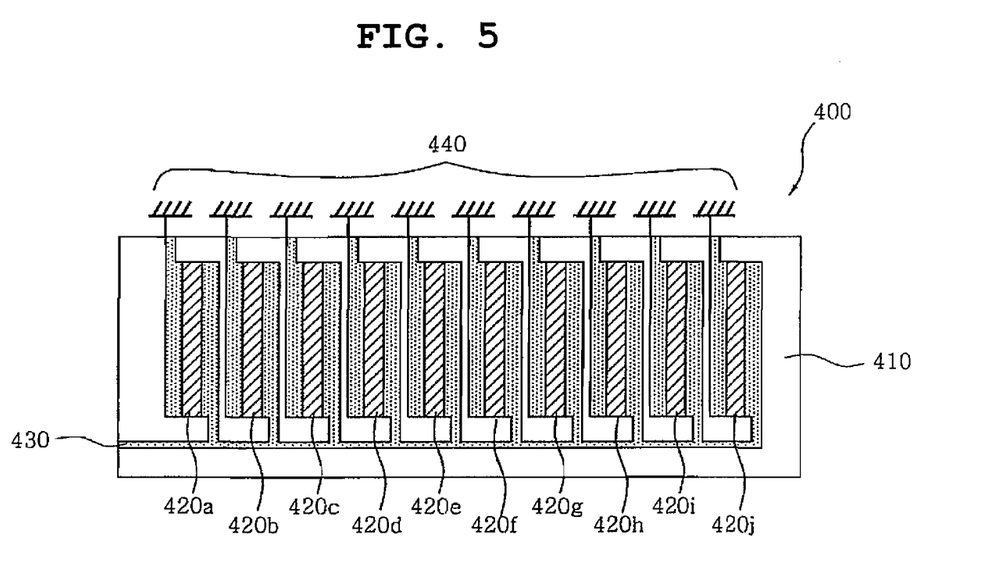
FIG. 5 is a plane view of a PCB including an embedded capacitor, according to yet another embodiment of the present invention.

FIG. 5 is a plan view of a PCB including an embedded capacitor, according to yet another embodiment of the present invention.

As shown in FIG. 5, in the PCB 400 including the embedded capacitor according to the above embodiment of the present invention, ten embedded capacitors 420a to 420j are parallelly formed through an insulating layer 410, first electrodes of the ten embedded capacitors 420a to 420j are connected to a power line 430 in parallel, and second electrodes of the ten embedded capacitors 420a to 420j are grounded 440.

In practice, in the PCB 400 including the embedded capacitor according to the present invention, it is possible to simultaneously fabricate a plurality of embedded capacitors through the procedure shown in FIGS. 3a to 3l. Furthermore, it is possible to provide a high capacitance by forming a circuit pattern for connecting the plurality of embedded capacitors in parallel.

Figure 6:
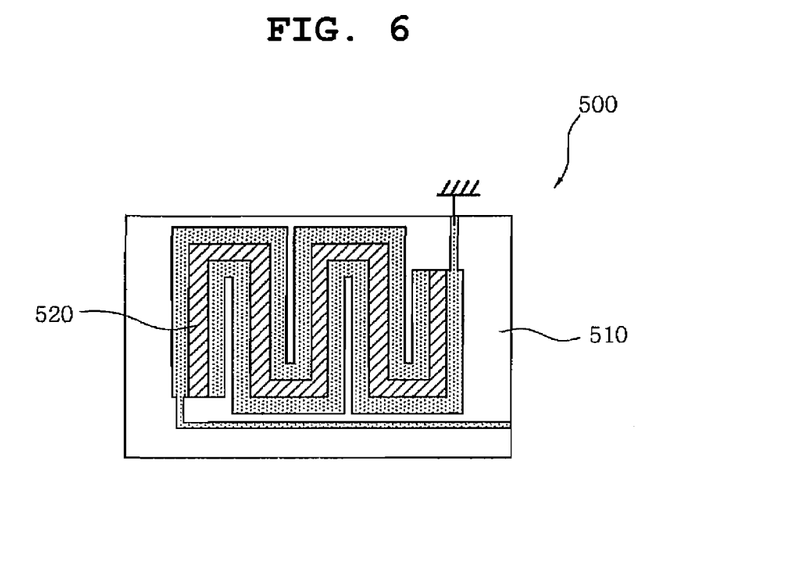
FIG. 6 is a plane view of a PCB including an embedded capacitor, according to an additional embodiment of the present invention.

FIG. 6 is a plan view of a PCB including an embedded capacitor, according to an additional embodiment of the present invention.

As shown in FIG. 6, in the PCB 500 including the embedded capacitor according to the above embodiment of the present invention, an embedded capacitor 520 is formed through an insulating layer 510 while being folded repeatedly.

Hence, in the PCB 500 including the embedded capacitor according to the present invention, it is possible to form the highly integrated embedded capacitor 520 through the narrow insulating layer 510 while folding it repeatedly using the procedure shown in FIGS. 3a to 3l, thereby providing a high capacitance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, a PCB including an embedded capacitor and a method of fabricating the same according to the present invention are advantageous in that a long highly integrated embedded capacitor is formed through an insulating layer, thereby providing a high capacitance.

Another advantage is that it is possible to form the long embedded capacitor in various shapes through the insulating layer, making various capacitance designs possible.

Still another advantage is that unnecessary circuit patterns are not formed in the course of fabricating the PCB and it is possible to realize high density in conjunction with typical circuit patterns.

What is claimed is:

1. A method of fabricating a printed circuit board including an embedded capacitor, comprising the steps of:
    (A) forming an opening through a copper clad laminate so that the opening is formed through upper and lower copper foil layers of the copper clad laminate and has a predetermined length;
    (B) forming first copper layers on the upper and lower copper foil layers of the copper clad laminate and on walls of the opening;
    (C) packing a high dielectric material in the opening, on the walls of which the first copper plating layers have already been formed;
    (D) forming second copper plating layers on the first copper plating and on the high dielectric material; and (E) partially etching the upper and lower copper foil layers, and the first and second copper plating layers in such a way that first and second electrodes are formed so as to extend along both longitudinal walls of a structure, which consists of the high dielectric material, to be in contact with the structure.

2. The method as set forth in claim 1, wherein the opening having the predetermined length is vertically formed through the upper and lower copper foil layers of the copper clad laminate in the step (A).

3. The method as set forth in claim 1, wherein the opening having the predetermined length is inclinedly formed through the upper and lower copper foil layers of the copper clad laminate in the step (A).

* * * * *